United States Patent [19]

Lentz et al.

[11] 4,369,660

[45] Jan. 25, 1983

[54] ELECTRONIC PRESSURE MEASURING APPARATUS

[75] Inventors: Richard P. Lentz; Thomas J. Lasky, both of Kenosha; Stephen B. Servais, Franksville, all of Wis.

[73] Assignee: Snap-On Tools Corporation, Kenosha, Wis.

[21] Appl. No.: 253,582

[22] Filed: Apr. 13, 1981

[51] Int. Cl.³ .............................................. G01L 9/04
[52] U.S. Cl. ......................................... 73/753; 73/115
[58] Field of Search ................. 73/115, 753, 754, 717, 73/718, 719, 720, 728

[56] References Cited

U.S. PATENT DOCUMENTS

| | | | |
|---|---|---|---|
| 701,383 | 5/1902 | Patten | 73/749 |
| 2,087,598 | 7/1937 | Hebler | 177/311 |
| 3,025,504 | 3/1962 | Ohse | 340/240 |
| 3,290,521 | 12/1966 | Coleman et al. | 310/2 |
| 3,505,804 | 4/1970 | Hofstein | 58/23 |
| 3,684,870 | 8/1972 | Nelson | 235/92 EA |
| 3,689,835 | 9/1972 | Bickfrod | 324/115 |
| 3,726,250 | 4/1973 | Merk | 116/129 |
| 3,772,874 | 11/1973 | Lefkowitz | 58/50 R |
| 3,831,431 | 8/1974 | Morris | 73/4 R |
| 3,914,758 | 10/1975 | Ingle | 340/336 |
| 4,003,370 | 1/1977 | Emil et al. | 73/753 |
| 4,086,804 | 10/1976 | Ruby | 73/4 R |
| 4,189,936 | 2/1980 | Ellis | 73/4 R |

*Primary Examiner*—Donald O. Woodiel
*Attorney, Agent, or Firm*—Dithmar, Stotland, Stratman & Levy

[57] ABSTRACT

There is disclosed a transducer to sense the vacuum in the intake manifold of an engine or other chamber. The electrical signal it produces is converted into digital signals for operating a liquid crystal display. The output of the transducer is also coupled to a driver which is operable in one mode to produce energizing currents on all of its outputs corresponding to the amplitude of the electrical signal. The driver is coupled to LEDs which are thus illuminated. The driver is also operated in a second mode so that only one of the outputs is energized and in that mode the driver receives only the AC component of the transducer output.

12 Claims, 4 Drawing Figures

ELECTRONIC PRESSURE MEASURING APPARATUS

BACKGROUND OF THE INVENTION

A vacuum gauge is an important tool in diagnosing engine performance and checking vacuum operated accessories in a vehicle. The most common such gauge currently being used employs a so-called bourdon tube as its sensitive element. The tube is thin walled, flattened and bent to a circular arc which tends to be straightened as the vacuum increases. Such a gauge has a circular dial and a rotating pointer. A hose is coupled between the intake manifold of the engine and the gauge. The pointer will reflect the amount of vacuum present in the intake manifold measured in, for example, inches of mercury or PSI. The pistons in the engine serve as suction pumps, and the degree of vacuum they create is affected by the related actions of piston rings, valves, ignition, carburetor, etc. Each has a characteristic effect on the vacuum and their performances can be judged by watching for variations from normal. Not only is it important to know the average value of the vacuum as indicated by the gauge, but also of significance is the manner in which it fluctuates about such average value. A bourdon gauge is capable of giving information on the average vacuum and its fluctuation about such average value.

Of course, there are a number of disadvantages associated with any mechanical device. Average value can only be estimated since the needle is constantly moving. Also, a mechanical gauge is more susceptible to damage and is of generally less reiablility.

An electronic gauge that digitally displays the average magnitude of the vacuum is not the answer because it does not give information on the manner in which the vacuum fluctuates about such average.

Others have proposed devices which electronically produce information on average value by use of a digital display, and fluctuations about that value by use of a bar display. U.S. Pat. No. 3,684,870 to Nelson and U.S. Pat. No. 3,726,250 to Merk disclose examples, although they are not directed to measurement of vacuum. Both suffer the disadvantage that fluctuations in the bar graph are difficult to perceive. For example, if the amplitude of the condition measured by the gauge in either patent fluctuated between say 150 units and 175 units, the user would find it difficult to perceive an amplitude other than 175, because latency in the display would make it difficult for him to perceive that the minimum of the fluctuation was 150.

The bar amplitude should follow fluctuations in vacuum amplitude as closely as possible. The slower the display response, the less likely the user will be able to perceive meaningful fluctuations. The bulbs used in the Merk indicator and the liquid crystal devices used in the Nelson bar display do not respond fast enough.

While the foregoing background has been described in the context of a means to measure the magnitude of the vacuum in the intake manifold of an engine, the same general principles are applicable to measuring pressure in any chamber where not only its magnitude is important but so too is the manner in which its magnitude changes.

SUMMARY OF THE INVENTION

It is therefore an important object of the present invention to provide an electronic pressure measuring apparatus which gives information on the magnitude of the pressure in a chamber and also how that pressure fluctuates.

Another object is to provide an electronic pressure measuring apparatus which produces a bar having one of two selected formats, one having its peak fluctuating in accordance with variations in the magnitude of the pressure, or one which represents only changes in the pressure magnitude.

Another object is to provide an electronic pressure measuring apparatus which precisely follows the fluctuations in pressure.

Another object is to provide an electronic pressure measuring apparatus in which the bar display consists of a plurality of light emitting diodes.

In summary, there is provided an electronic pressure measuring apparatus for measuring the pressure in a chamber, comprising a pressure transducer adapted to be coupled to the chamber for generating a composite electrical signal having an amplitude related to the magnitude of the pressure in the chamber, the composite electrical signal having a DC component and an AC component, means for converting the composite electrical signal into digital signals, means for displaying digits corresponding to the digital signals, means for passing only the AC component of the composite electrical signal, driver means being operable in first and second modes and having an input and a plurality of outputs respectively corresponding to a plurality of amplitudes of an electrical signal applied to said input, the driver means in the first mode thereof being constructed and arranged to produce an energizing current on all of the outputs up through the output corresponding to the amplitude of an electrical signal applied to said input, the driver means in the second mode thereof being constructed and arranged to produce an energizing current on only the one of the outputs corresponding to the amplitude of the electrical signal, means for coupling the composite electrical signal to the driver means when in the first mode thereof and for coupling the AC component to the driver means when in the second mode thereof, and a plurality of separate lights respectively coupled to the outputs and being illuminated in the presence of energizing currents.

In another aspect of the invention, the electronic pressure measuring apparatus comprises a pressure transducer adapted to be coupled to the chamber for generating a composite electrical signal having an amplitude related to the magnitude of the pressure in the chamber, means for converting the composite electrical signal into digital signals, means for displaying digits corresponding to the digital signals, driver means having an input and a plurality of outputs respectively corresponding to a plurality of amplitude of an electrical signal applied to the input, the driver means being constructed and arranged to produce an energizing current on all of the outputs up through the output corresponding to the then amplitude of an electrical signal applied to the input, means for coupling the composite electrical signal to the driver means, and a plurality of separate light emitting diodes respectively coupled to the outputs and being illuminated in the presence of energizing currents.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the invention.

BRIEF DESCRIPTION OF THE DRAWINGS

For the purpose of facilitating an understanding of the invention, there is illustrated in the accompanying drawings, a preferred embodiment thereof, from an inspection of which, when considered in connection with the following description, the invention, its construction, and operation, and many of its advantages should be readily understood and appreciated.

DETAILED DESCRIPTION OF THE PREFERRED EMBODIMENT

Figure 1:
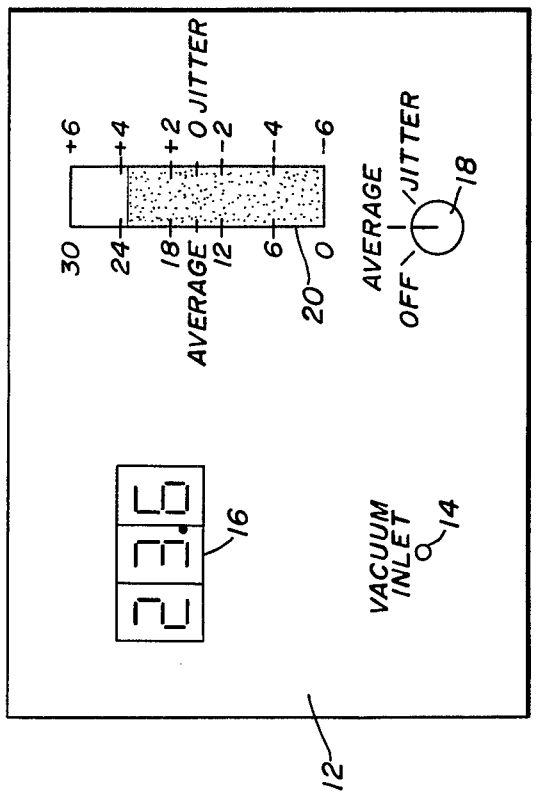
FIG. 1 depicts the front panel of an electronic pressure measuring apparatus incorporating the features of the present invention.

Turning now to the drawings, and more particularly to FIG. 1 thereof, there is depicted an electronic pressure measuring apparatus 10 having a front panel 12. Protruding from the front panel is a fitting 14 for connection to a hose, the other end of which is coupled to the intake manifold of the engine being diagnosed; thus, the legend "vacuum inlet" near the fitting 14. As an example, throughout this application, the apparatus 10 is described as usable to measure the vacuum in the intake manifold. It is to be understood that the performance of vacuum operated accessories could also be checked. Also protruding from the front panel 12 is the knob of a three position switch 18. In the "off" position, current drain on the internal battery is minimized or eliminated by disconnecting the circuits that drain power from the battery. The switch 18 has two other positions marked "average" and "jitter" respectively corresponding to similar markings on a bar display 20.

The pressue measuring apparatus 10 includes a digital display 16 which for puproses of illustration depicts the number "23.6". The display 16 depicts the average magnitude of the vacuum in the chamber to which the vacuum inlet fitting 14 is coupled, in inches of mercury. Thus, the number "23.6" represents 23.6 inches of mercury vacuum. Atmospheric pressure is about 30 inches of mercury and, of course, a perfect vacuum would be about 30 inches of mercury.

In both the "average" and "jitter" positions of the switch 18, the display 16 will depict the average vacuum in the chamber being evaluated.

The "average" and "jitter" positions of the switch 18 control the format of the bar display 20. In the "average" position, the bar is substantially that shown in FIG. 1, that is, one extending from zero up to a line corresponding to 23.6. In the average mode, the numbers on the left of the bar display 20 are applicable and those on the right can be ignored. If there are rapid fluctuations in the vacuum about the average depicted on the display 16, it will be represented by rapid changes in the height of the bar, say from 25.6 to 21.6. A skilled technician can detect malfunctions of the engine depending on such fluctuations. The bar display 20 is a stack of light emitting diodes, as will be described, which respond very quickly to voltages applied thereto so that the amplitude of the bar in essence follows the fluctuations in the vacuum. The serviceman will readily see the bar fluctuating in amplitude. He will find it difficult to detect the minimum, because the latency of vision above such minimum will cause them to appear to remain illuminated.

Figure 2:
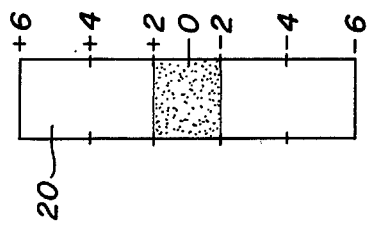
FIG. 2 depicts the bar gauge of the electronic pressure measuring apparatus in its "jitter" or non-average mode.

To detect such fluctuation more accurately, the user can switch to the "jitter" mode by operating the switch 18. In the "jitter" mode, the numbers on the right side of the bar display 20 are used. FIG. 2 depicts the bar display 20 when the apparatus is in the jitter mode, using the example just given. If the vacuum did not fluctuate, that is, stay at 23.6, a horizontal line at zero would be depicted. However, any fluctuation in the vacuum would cause the bar to increase in length if, for example, the vacuum fluctuated between 21.6 and 25.6, the average of 23.6 would be depicted on the display 16 and the bar would extend between ±2. Because the bar display 20 employs LEDs, the bar fluctuates in amplitude basically as rapidly as the vacuum fluctuates in magnitude. The user is readily able to perceive the magnitude of these fluctuations.

Figure 3:
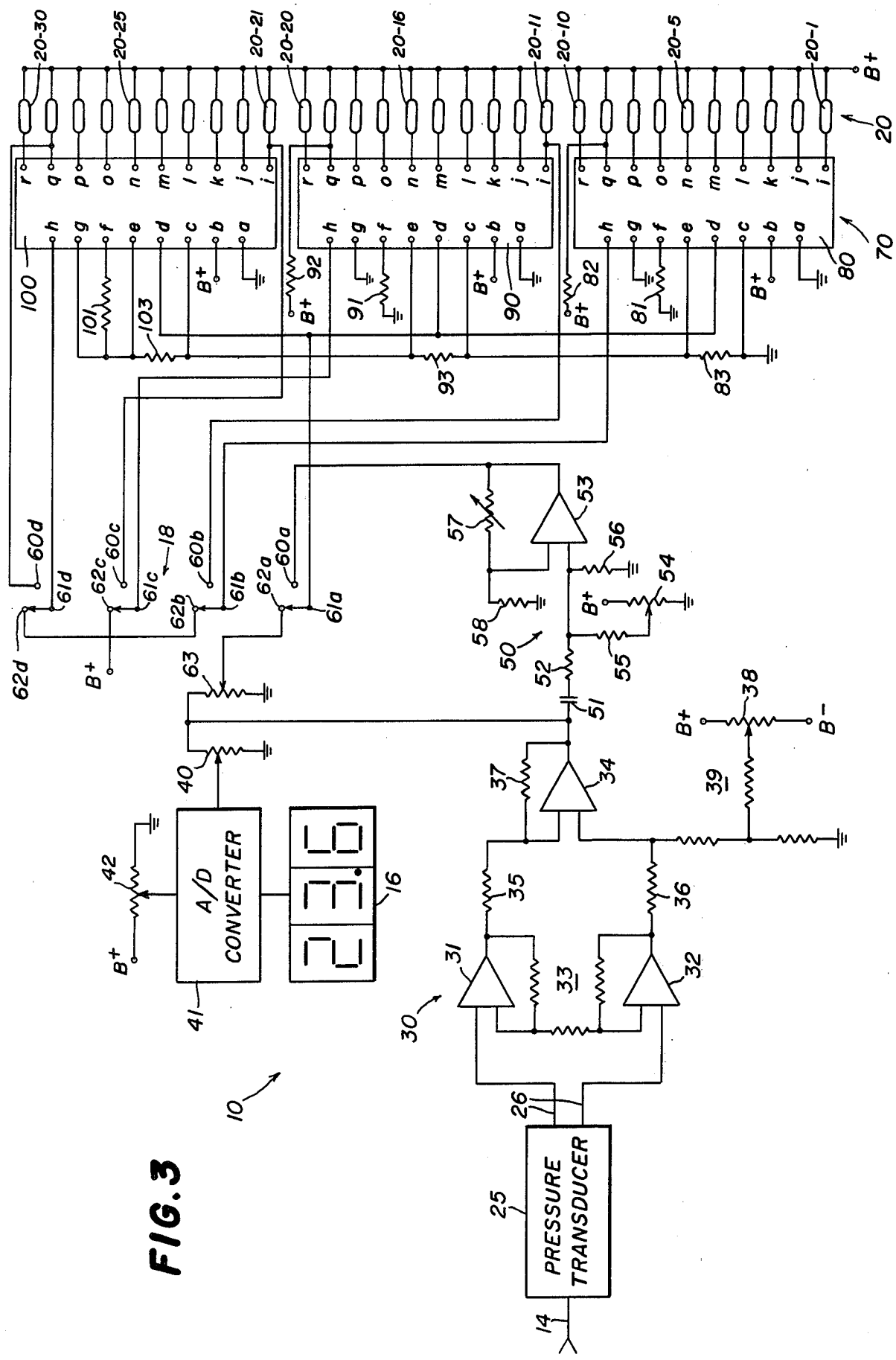
FIG. 3 is a diagram partially in block and partially in schematic, of the electronic pressure measuring apparatus.

Turning now to FIG. 3, details of the circuitry of the electronic pressure measuring apparatus 10 will be described. The hose from the intake manifold is coupled to the input fitting 14 in turn connected to a pressure transducer 25 which produces an electrical signal across its output conductors 26. The amplitude of the electrical signal is proportional to the magnitude of the vacuum in the intake manifold. If the vacuum is constant, the electrical signal will be a DC voltage. Actually, the vacuum is not constant and the electrical signal will have both an AC component and a DC component. In an operative embodiment of the pressure measuring apparatus 10, the pressure transducer 25 was made by Micro Switch Division of Honeywell, Inc., under its Model No. PK87660.

The electrical signal on the conductor 26 is coupled to a signal processing circuit 30 which includes a pair of op amps 31 and 32 biased by a resistor network 33. The processing circuit 30 also includes a third op amp 34 having its inputs coupled to the op amps 31 and 32 by means of resistors 35 and 36 respectively. The op amp 34 is biased by a resistor 37. The op amp 34 further amplifies the electrical signal and cancels any offset voltage produced by the pressure transducer 25. Such offset voltages are amplified by the op amps 31 and 32, thereby causing cancellation when differenced by the op amp 34. The processing circuit 30 includes a potentiometer 38 coupled between B+ and B− through a resistor network 39 to one of the inputs of the op amp 34. The potentiometer 38 is factory adjusted to insure complete cancellation of any offset.

The composite electrical signal with its DC component and its AC component are coupled to a potentiometer 40, the arm of which is coupled to an analog-to-digital converter 41. The converter 41 converts the electrical signal into digital signals in a well-known fashion to drive the digital display device 16. The potentiometer 40 is factory set so that the number depicted on the display device 16 is a true reading of the magnitude of the vacuum in the intake manifold. Preferably the display 16 is liquid crystal so as to be relatively slow acting. In other words, it is desirable that the number depicted on the display 16 not be continuously changing because that would make it difficult to read. Instead, it should depict an average value about which the vacuum is fluctuating. In an operative embodiment of the apparatus 10, the converter 41 was made by Intersil, Inc. under its Model No. ICL7106. This converter has an autozeroing capability. However, to insure a given reading in the presence of a vacuum of the corresponding number of inches of mercury, a potentiometer 42 is provided for factory adjustment.

The composite electrical signal is also applied to an AC component amplifying circuit 50 which includes a capacitor 51 coupled in series with a resistor 52 to the signal input of an amplifier 53. A potentiometer 54 applies an adjustable voltage to the resistors 55 and 56 connected in series to ground. The junction of the resistors 55 and 56 is a signal input of the amplifer 53. The amplifier 53 has a feedback potentiometer 57 and a resistor 58 coupled to ground. The potentiometer 57 controls the gain of the amplifier 53. The circuit 50 allows passage of only the AC component in the composite electrical signal, by virtue of the capacitor 51, and amplifies the same. The output of the circuit 50 is coupled to one fixed contact 60a of the switch 18. The switch 18 is shown to have four sets of contacts. The four sets have first fixed contacts 60a-d, second fixed contacts 62a-d and movable contacts 61a-d. In practice, the switch 18 also has additional contact treads for purposes not important to this application. Also, in an operative embodiment, the switch 18 had another fixed contact corresponding to the "off" position shown in FIG. 1.

The composite electrical signal from the processing circuit 30 is also coupled to a potentiometer 63, the movable arm of which is coupled to the fixed contact 62a of the switch 18. The switch 18 is shown in the "average" mode so that the positive electrical signal from the circuit 30 is coupled to the contact 61a. In the "jitter" mode, the amplified AC component from the circuit 50 will be present on the contact 61a.

The apparatus 10 also includes a driver circuit 70 for driving the display 20. The driver circuit 70 actually includes three individual driver devices 80, 90 and 100.

Figure 4:
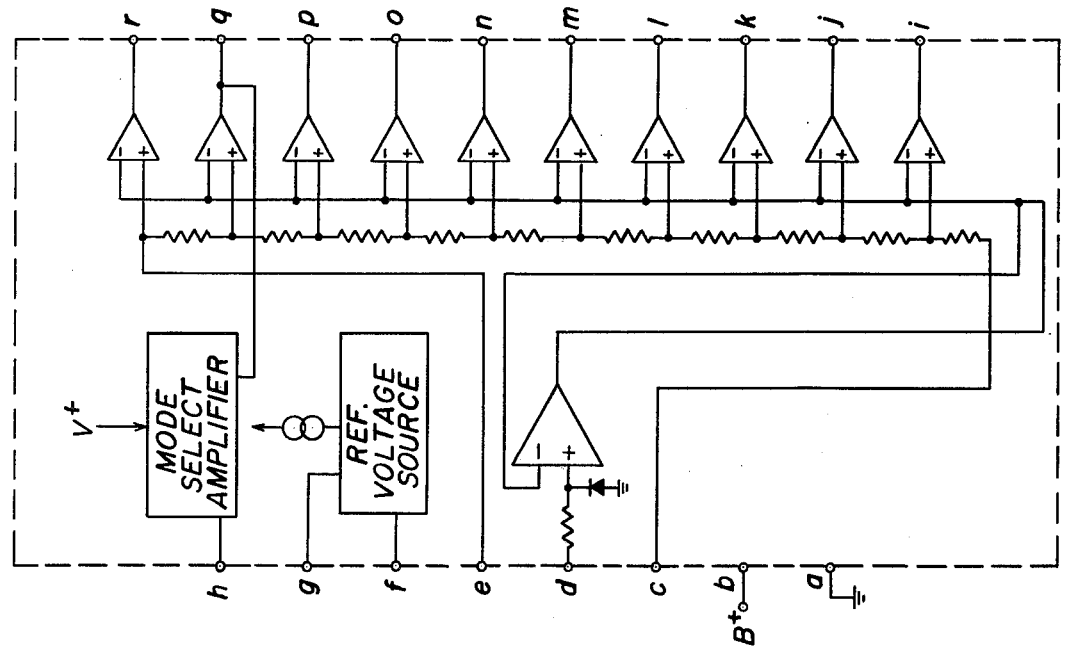
FIG. 4 is a diagram partially in block and partially in schematic of one of the driver devices used in the circuit of FIG. 3.

One of the driver devices is depicted in FIG. 4. It has pin a for connection to ground, pin b for connection to the supply voltage. Pin c is one end of a series of ten resistors and pin e is the other end. Pin d is the signal input coupled through a buffer amplifier to ten comparators, each of which is biased to a different comparison level by a series of resistors. Pin f is coupled to the reference voltage source which supplies power to the comparators.

The greater the resistive load on pin f, the less the brightness of the LEDs in the display driven by the driver device. Pin g controls the value of the reference voltage. Pin h is the input to the mode select amplifier device and may be operated to furnish a dot or a bar. For the former, only one LED is energized at any one instant of time, whereas to produce a bar, all LEDs up through that one LED are energized simultaneously. Finally, the device includes ten output pins i–r. The output pins respectively correspond to a plurality of amplitudes of an electrical signal applied to input pin d. For each 10% that the voltage between the pins d and e increases, an additional comparator will switch on providing an energizing current on its associated output. When pin h is connected to B+, the driver is placed in its bar mode. In that mode, the output pin corresponding to a particular amplitude of the electrical signal at the input d will provide an energizing current; and energizing currents will also appear on all of the output pins below that. For example, suppose two volts is placed across pins e and c. If no input signal is present, an energizing current appears on none of the output pins. If the input signal has an amplitude of 0.4 volt, an energizing current appears at output pins i and j while a two volt input signal causes all output pins i–r to produce energizing currents.

When pin h is connected to pin j, the driver is in its dot-display mode, meaning that only the output pin corresponding to the particular amplitude of the electrical signal at the input pin d will produce an energizing current. Continuing with the two volt example, in the dot display mode, an electrical signal with an amplitude of 0.4 volt would cause an energizing current to appear on the pin j while a two volt electrical signal would cause an energizing current to appear on the output pin r.

Referring back to FIG. 3, the display 20 includes 30 LEDs 20-1 to 20-30. The LEDs 20-1 to 20-10 are respectively coupled to the output pins i–r of the device 80, the LEDs 20-11 to 20-20 are respectively coupled to the output pins i–r of the device 90, and the LEDs 20-21 to 20-30 are respectively coupled to the output pins i–r of the device 100. The other terminals of each of the LEDs 20-1 to 20-30 are connected to B+. In each case, the energizing current is ground potential, so that any LED to which an energizing current is applied becomes illuminated. Each of the LEDs has an oblong aspect so that when illuminated, it appears to be a horizontal line. An LED with a round aspect could be substituted in which case when illuminated it would appear as a dot.

Pin a of each of the three devices is connected to ground and pin b is connected to the supply voltage. The signal input pins d of the three devices are connected together and to the movable contact 61a of the switch 18. Pins f of the devices 80 and 90 are connected through resistors 81 and 91 respectively to ground, the value of which controls the brightness of the LEDs. The terminals g of the devices 80 and 90 are connected to ground while the mode select pins h of the three devices are respectively coupled to the movable contacts 61b, 61c and 61d of the switch 18.

The resistor chains in the three devices are respectively coupled in series by connecting pin f of the device 100 through a resistor 101 to its pin e, pin c of the device 100 to pin e of the device 90, pin c of the device 90 to pin e of the device 80, and pin c of the device 80 to ground. Resistors 83, 93 and 103 are connected between pins c and e of the devices 80, 90 and 100 respectively. These resistors "swamp" the resistor chains, by having a much lower value. In an operating embodiment, each resistor in the resistor chain had a nominal value of 1k and each of the resistors 83, 93 and 103 had a value of 374 ohms. As a result, although the actual value of the resistors in the chain of one of the devices is likely to differ from the resistor values in the other devices, each device is assured of having one-third of the total voltage across its resistor chain.

The fixed contacts 62b, 62c and 62d are connected to the B+ supply voltage, so that when the switch 18 is in the position shown, the B+ supply voltage is coupled to the mode select pins h of the devices 80, 90 and 100 to place them in their bar mode. Also, the composite electrical signal from the processing circuit 30 is coupled by way of the contacts 62a and 61a to the three devices 80, 90 and 100. The potentiometer 63 is set such that an electrical signal corresponding to a given pressure will cause a correponding number of the output pins to produce energizing currents. On the other hands, when the vacuum is say thirty inches of mercury, all of the thirty output pins i–r of the devices 80, 90 and 100 will be energized and all thirty LEDs 20-1 to 20-30 will be illuminated.

The electrical signals applied to the three input pins d of the devices 80, 90 and 100. If the amplitude of the signal is say a third of the voltage applied between the pin e of the device 100 and ground, then the output pin r of the device 80 is energized. Because the device 80 is in its bar mode, an energizing current will appear also on the output pins i–q of the device 80. Thus, the LEDs 20-1 to 20-10 will be illuminated. If the vacuum in the intake manifold is 23.6 inches of mercury as shown in FIG. 1, then the amplitude of the electrical signal applied to the pins d of the three devices will be such that energizing current will be produced on all the output pins of the devices 80 and 90 and on the pin i of the device 100.

Whereas the digital display 16 is liquid crystal and therefore relatively slow acting, the display 20 utilizes light emitting diodes and therefore is very fast acting, on the order of 10,000 times as fast.

In the dot mode, the switch 18 is operated to cause the movable contacts 61a–61d to engage the contacts 60a–60d respectively. In this mode, the three drivers 80, 90 and 100 are cascaded because pin h of the device 80 is connected to pin i of the device 90, pin h of the device 90 is connected to pin i of the device 100, and pin h of the device 100 is connected to pin q thereof. In this mode, the AC component of the composite electrical signal which has been amplified by the amplifier 53 is coupled to the driver circuit 70. The amplified component will cause an energizing current to appear on only one of the output pins corresponding to the amplitude of such component. For example, if the instantaneous amplitude is such that it is produced in response to a vacuum of 24 inches of mercury, then the energizing current will appear only on the output pin j of the device 100. Any fluctuations in the vacuum will be reflected as fluctuations in the amplitude of the electrical signal applied to the driver circuit 70 causing different ones of the output pins to produce an energizing current. Thus, different ones of the LEDs 20-1 to 20-30 will become illuminated as the vacuum fluctuates. These LEDs previously mentioned have an extremely fast response time so that even the most instantaneous fluctuations are reflected in controlling which LEDs are illuminated. Because of latency of vision, they appear to remain illuminated for a period of time so the although the energization current appears and disappears substantially instantaneously, a bar will seemingly be produced by the display 20. The size of the bar will reflect the magnitude of the fluctuation in the vacuum.

The potentiometer 54 is factory set to cause the middle LED 20-15 to become illuminated in response to a vacuum of average value. In other words, with no fluctuation whatsoever, the middle LED 20-15 corresponding to this zero reading of FIG. 2 should become illuminated. The potentiometer 57 which controls the gain of the amplifier 53 is set to establish that the reading on the scale will match the actual fluctuation. In other words, if the average is a given value and instanteously increases two inches of mercury, then the upper end of the bar should extend to the +2 LED.

In the example FIG. 2, the scale of the jitter mode extends from −6 to +6 inches of mercury meaning that each diode represents 0.4 inch. Thus, for example the LED 20-20 would become illuminated if the vacuum decreased so that the pressure were two inches of mercury greater. On the other hand, the LED 20-5 will become illuminated if the vacuum increased to the point where the pressure was four inches of mercury less. As the vacuum fluctuates between those extremes, the LEDs 20-5 through 20-20 will become illuminated and because of latency of vision, the display 20 will depict what appears to be a bar extending from the LEDs 20-5 through 20-20.

In the "jitter" mode, the user can quickly determine the average value of the vacuum by examining the LCD display 16 and will be able to accurately determine the amount of fluctuation in the vacuum by examining the bar graph. Because the A/D converter 41 is slow acting, the LCD display 16 does not change in response to these rapid fluctuations and therefore is readily readable. LEDs respond very rapidly, about 10,000 times as fast as an LCD, to the fluctuations so that the user can readily determine what the fluctuation is and how it changes. When the switch 18 is in the average mode, the height of the bar is fluttering signifying that the vacuum is fluctuating. It is fairly simple to read the maximum of the flutter but it is difficult to read its minimum because of latency of vision. In other words, the LEDs above the minimum continue to be illuminated for a few milliseconds. If the magnitude of the fluctuation is important, when the user simply moves the switch 18 to the "jitter" position whereupon the amplitude of the bar clearly indicates the amount of variation in the vacuum.

What has been described therefore is an improved electronic pressure measuring apparatus which has a liquid crystal display to depict average pressure in a chamber, and a fast acting LED display to depict rapid fluctuations in the pressure. The bar display may depict a bar whose amplitude represents the instantaneous magnitude of the pressure or a jitter mode in which the bar is centered and both ends fluctuate in accordance with the fluctuation in the pressure.

We claim:

1. Electronic pressure measuring apparatus for measuring the pressure in a chamber, comprising a pressure transducer adapted to be coupled to the chamber for generating a composite electrical signal having an amplitude related to the magnitude of the pressure in the chamber, the composite electrical signal having a DC component and an AC component, means for converting the composite electrical signal into digital signals, means for displaying digits corresponding to the digital signals, means for passing only the AC component of the composite electrical signal, driver means being operable in first and second modes and having an input and a plurality of outputs respectively corresponding to a plurality of amplitudes of an electrical signal applied to said input, said driver means in the first mode thereof being constructed and arranged to produce an energizing current on all of said outputs up through the output corresponding to the amplitude of an electrical signal applied to said input, said driver means in the second mode thereof being constructed and arranged to produce an energizing current on only the one of said outputs corresponding to the amplitude of the electrical signal, means for coupling the composite electrical signal to said driver means when in the first mode thereof and for coupling the AC component to said driver means when in the second mode thereof, and a plurality of separate lights respectively coupled to said outputs and being illuminated in the presence of energizing currents.

2. The pressure measuring apparatus of claim 1, wherein said AC component passing means includes a capacitor.

3. The pressure measuring apparatus of claim 1, wherein said AC component passing means includes a variable gain amplifier.

4. The pressure measuring apparatus of claim 1, wherein said coupling means includes a single-pole double-throw switch having a common terminal and two output terminals, said common terminal being coupled to said driver means, and said output terminals being respectively coupled to said AC component passing means and said pressure transducer.

5. The pressure measuring apparatus of claim 1, wherein said driver means includes a plurality of cascaded driver devices.

6. The pressure measuring apparatus of claim 1, wherein said separate lights are light emitting diodes.

7. The pressure measuring apparauts of claim 1, and further comprising means for amplifying the composite electrical signal prior to application to said converting means and to said driver means and to said AC component passing means.

8. The pressure measuring apparatus of claim 1, and further comprising means for removing any DC offset and the composite electrical signal produced by said pressure transducer.

9. The pressure measuring apparatus of claim 1, wherein the plurality of outputs of said driver means do not correspond to the same plurality of amplitudes of the electrical signal in the first and second modes of said driver means.

10. The pressure measuring apparatus of claim 1, wherein said AC component passing means includes means for causing a predetermined light to become illuminated when the electrical signal has zero amplitude.

11. Electronic pressure measuring apparatus for measuring the pressure in a chamber, comprising a pressure transducer adapted to be coupled to the chamber for generating a composite electrical signal having an amplitude related to the magnitude of the pressure in the chamber, means for converting the composite electrical signal into digital signals, means for displaying digits corresponding to the digital signals, driver means having an input and a plurality of outputs respectively corresponding to a plurality of amplitudes of an electrical signal applied to said input, said driver means being constructed and arranged to produce an energizing current of all of said outputs up through the output corresponding to the then amplitude of an electrical signal applied to said input, means for coupling the composite electrical signal to said driver means, and a plurality of separate light emitting diodes respectively coupled to said outputs and being illuminated in the presence of energizing currents.

12. The pressure measuring apparatus of claim 11, wherein said digit display means is of the liquid crystal type.

* * * * *